US008611105B2

(12) United States Patent
Liu et al.

(10) Patent No.: US 8,611,105 B2
(45) Date of Patent: Dec. 17, 2013

(54) SLIDE BUTTON, SWITCHING ASSEMBLY, AND ELECTRONIC DEVICE USING THE SAME

(75) Inventors: Wei Liu, Shenzhen (CN); Min-Li Li, Shenzhen (CN); Na Wang, Shenzhen (CN); Bao-Gang Zhao, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 355 days.

(21) Appl. No.: 13/042,095

(22) Filed: Mar. 7, 2011

(65) Prior Publication Data

US 2012/0170234 A1 Jul. 5, 2012

(30) Foreign Application Priority Data

Dec. 31, 2010 (CN) .......................... 2010 1 0616917

(51) Int. Cl.

*H05K 7/02* (2006.01)
*H01H 1/36* (2006.01)
*H01H 1/52* (2006.01)
*H01H 15/10* (2006.01)

(52) U.S. Cl.

USPC ........... 361/807; 361/809; 361/810; 200/252; 200/327; 200/547

(58) Field of Classification Search

USPC .......... 361/807, 809, 810; 200/237, 252, 327, 200/338, 341, 536, 547

See application file for complete search history.

(56) References Cited

U.S. PATENT DOCUMENTS

| | | | | |
|---|---|---|---|---|
| 6,310,766 | B1 * | 10/2001 | Bae | 361/679.27 |
| 7,375,952 | B2 * | 5/2008 | Tsai | 361/679.01 |
| 7,554,050 | B1 * | 6/2009 | Lv | 200/339 |
| 7,638,722 | B2 * | 12/2009 | Iijima | 200/293 |
| 2008/0029379 | A1 * | 2/2008 | Guo | 200/547 |
| 2008/0060929 | A1 * | 3/2008 | Iijima | 200/547 |
| 2008/0088489 | A1 * | 4/2008 | Moon | 341/22 |

* cited by examiner

*Primary Examiner* — Jeremy Norris
*Assistant Examiner* — Sherman Ng
(74) *Attorney, Agent, or Firm* — Altis Law Group, Inc.

(57) ABSTRACT

A slide button, used for activating a mode of an electronic device by operating a toggle switch on a circuit board of the electronic device, includes an operating member, an activating member, and a positioning member. The operating member defines a first surface used for applying a force therein and a second surface opposite to the first surface. The activating member includes two tail fins and a positioning member respectively extending from the second surface. The tail fin defines an opening. The toggle switch is received in the opening. The connecting board is received in the opening and used for enhancing the strength of the two tail fins. The positioning member is connected to the two tail fins and spaced apart from the operating member. The positioning member and the operating member together secure the slide button to the electronic device.

8 Claims, 7 Drawing Sheets

SLIDE BUTTON, SWITCHING ASSEMBLY, AND ELECTRONIC DEVICE USING THE SAME

BACKGROUND

1. Technical Field

The present disclosure relates to slide buttons, and more particularly to a slide button for a switching assembly and an electronic device with the slide button accommodated therein.

2. Description of Related Art

Slide buttons have many applications and are given much attention. As such, slide buttons are widely employed in microcomputers, household appliances, and computer peripherals. The slide button can be implemented as an on/off switch, a mode switch, or an open/close switch of a component of the electronic product.

Referring to FIG. 7, conventionally, a typical slide button 90 includes an operating member 92, an activating member 94, and a positioning member 96. The operating member 92 defines a first surface 920, which receives an applied force. The activating member 94 connects the operating member 92 and the positioning member 96. The operating member 92 and the positioning member 96 work together to secure the slide button 90 to an electronic device (not shown). The activating member 94 includes two parallel tail fins 944 used to activate a toggle switch (not shown) of the electronic device, the toggle switch is received in a receiving portion 940 defined by the two parallel tail fins 944.

However, the two tail fins 944 are separated from the operating member 92 and are on the ends of the activating member 94. As such, the two tail fins 944 may crack very easily, from the torque of the combined force, which is applied to the toggle switch and stress from the operating member 92.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiment of a switching assembly and an electronic device with the slide button accommodated therein. Moreover, in the drawings, like reference numerals designate corresponding parts throughout the views.

DETAILED DESCRIPTION

Embodiments of the present disclosure will now be described in detail with reference to the drawings.

Figure 1:
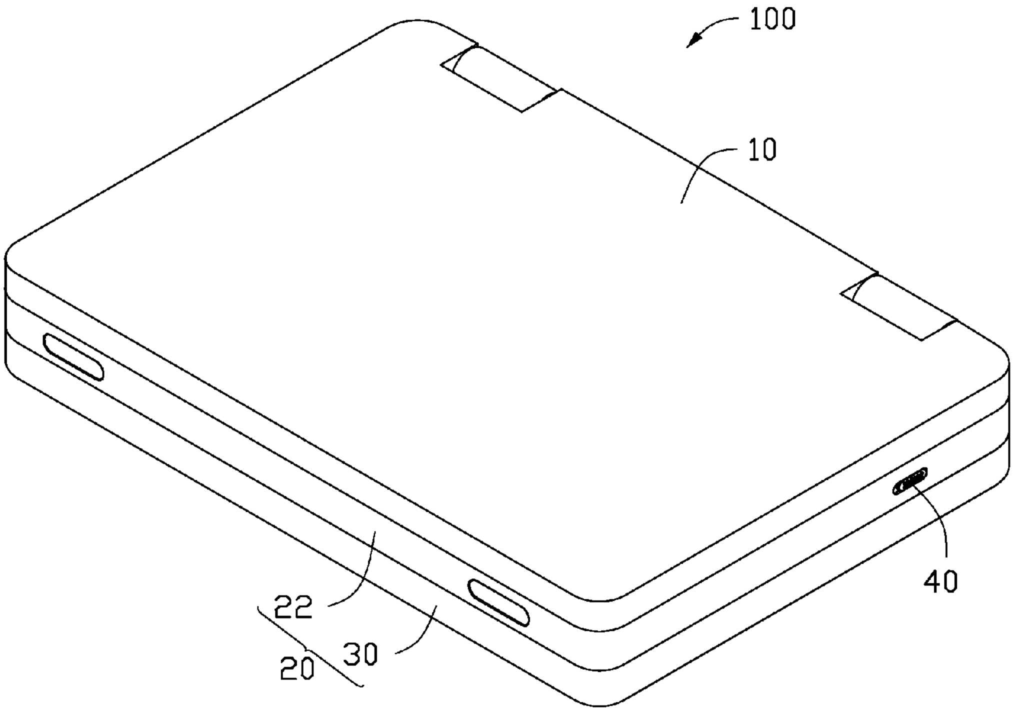
FIG. 1 is an isometric view of an electronic device with a slide button in accordance with an exemplary embodiment.
Figure 2:
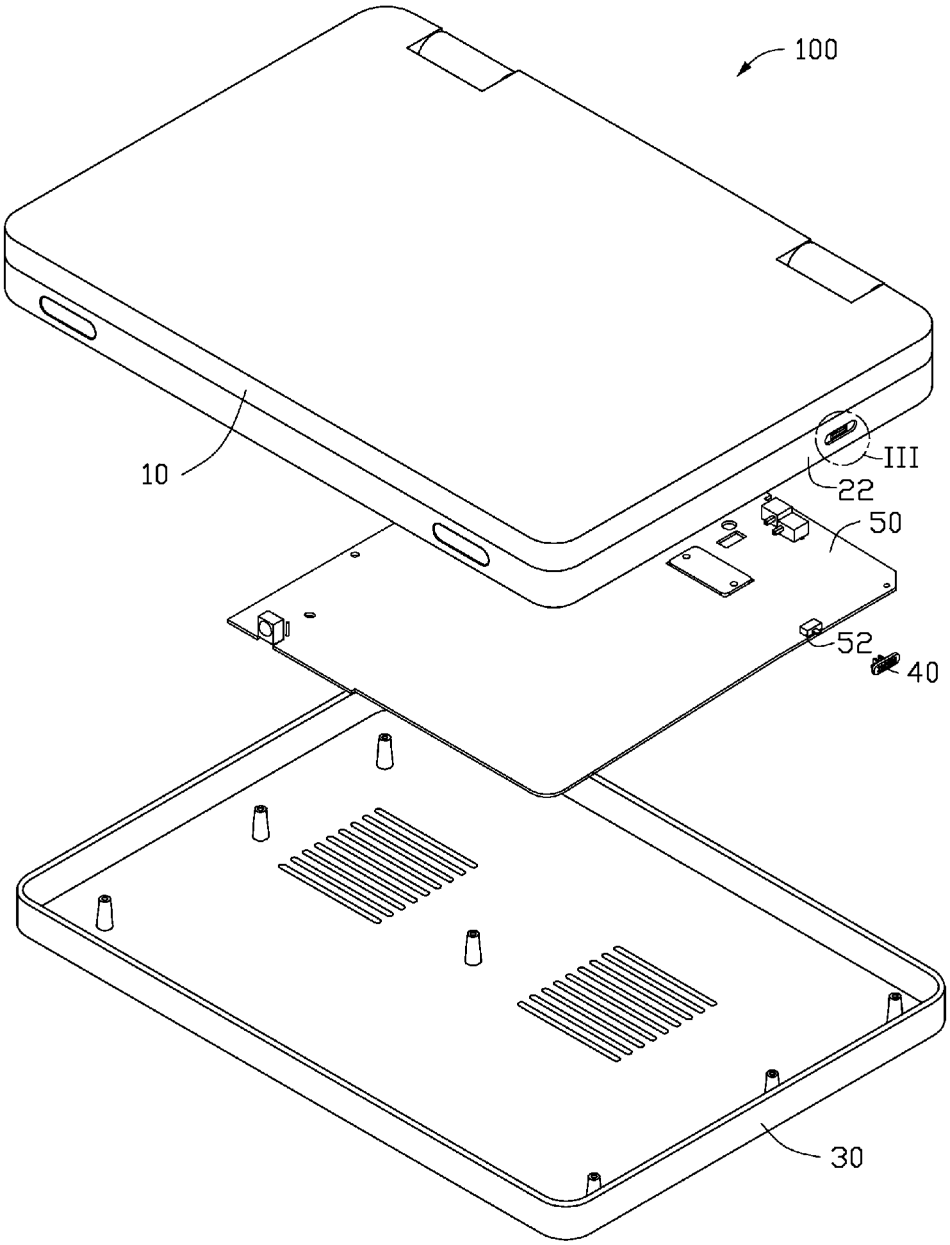
FIG. 2 is an exploded view of the electronic device of FIG. 1, the electronic device including a cover, a base, and a circuit board.

Referring to FIGS. 1 and 2, an electronic device 100 according to an exemplary embodiment is illustrated. The electronic device 100 may be a DVD player. The electronic device 100 includes a lid 10, a base 20, a slide button 40, and a circuit board 50. The lid 10 is pivotably mounted with the base 20. The base 20 is used to receive the circuit board 50. The slide button 40 is attached to a side wall 22 of the base 20 to activate a mode of the electronic device 100 by operating a toggle switch 52 on the circuit board 50. The base 20 also includes a bottom casing 30 coupled together with the side wall 22.

Figure 3:
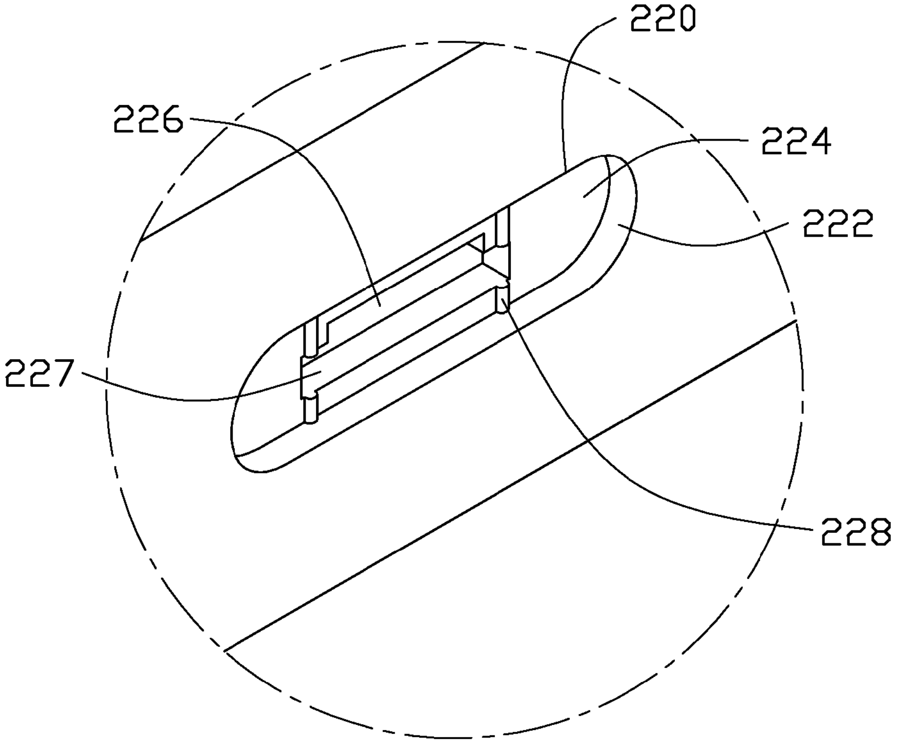
FIG. 3 is an enlarged view of circled portion III of the cover in FIG. 2.

Referring to FIG. 3, the side wall 22 forms an oblong housing 220 to receive the slide button 40. The housing 220 is depressed from the side wall 22, and includes a periphery 222 and a bottom 224 surrounded by the periphery 222. A rectangular first cutout 226 and a pair of rectangular second cutouts 227 are successively defined in the bottom 224 of the housing 220. The first cutout 226 has a width wider than that of the second cutouts 227 communicating with the second cutouts 227. The first cutout 226 is positioned between the second cutouts 227.

The bottom 224 includes two parallel first ribs 228, which are positioned besides of the first cutout 226 and are perpendicularly passed through the second cutout 227. The first ribs 228 are used for contacting with the slide button 40 and decreasing a contacting area between the slide button 40 and the bottom 224, as a result, allowing the slide button 40 to smoothly slide with respect to the housing 220.

Figure 4:
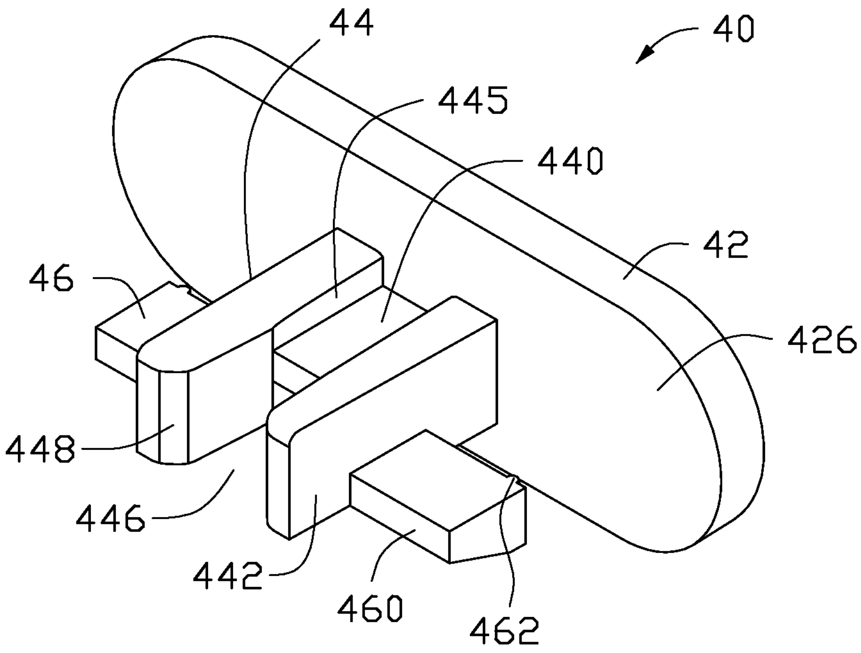
FIG. 4 is an enlarged view of the slide button of FIG. 2.
Figure 5:
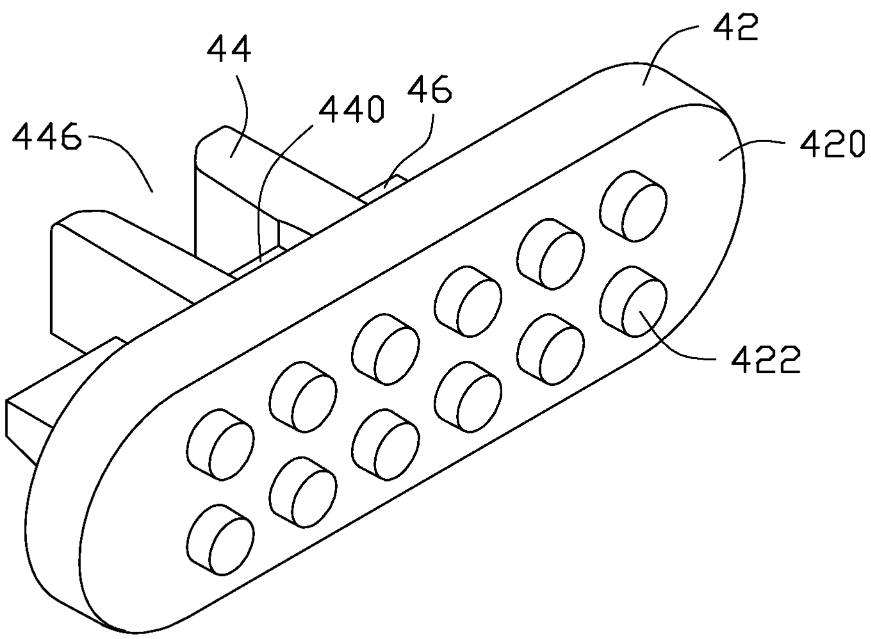
FIG. 5 is similar to FIG. 4, but viewed from an inverted aspect.

Referring to FIGS. 4 and 5, the slide button 40 is integrally formed. The slide button 40 includes an operation member 42, an activating member 44, and a positioning member 46. The activating member 44 connects to the operating member 42, and intersects with positioning member 46.

The operating member 42 is an oblong piece for users to operate and includes a first surface 420 and a second surface 426 opposite to the first surface 420. The operating member 42 is received in the housing 220. The operating member 42 slides along a sliding direction parallel to an elongated side of the housing 220. A plurality of projections 422 extends perpendicularly from the first surface 420 of the operating member 42 to increase static friction between operators and the operating member 42.

The activating member 44 extends from a center of the second surface 426. The activating member 44 is used for activating the toggle switch 52 on the circuit board 50 via the first cutout 226. The activating member 44 includes a connecting board 440 and two tail fins 442 both perpendicularly extending from the second surface 426. A receiving space 445 is defined between the two tail fins 442 to receive the connecting board 440. The connecting board 440 is used for enhancing the two tail fins 442. An opening 446 is defined between the two fail fins 442 and used for receiving the toggle switch 52. The opening 446 communicates with the receiving space 445. Each portion of the two tail fins 442 form a round corner 448 at an adjacent end corner for easy insertion through the first cutout 226 and guide the toggle switch 52 that is inserted into the opening 446.

The positioning member 46 extends out from the activating member 44. The positioning member 46 is spaced apart from the operating member 42 to form two side fins 460, and is used for sandwiching the bottom 224 of the housing 220 together with the operating member 42. The side fins 460 are elastic. The side fins 460 may be made of plastic material. In this embodiment, the side fins 460 are two wedges, which the initial height of the wedges 460 are no less than that of the second cutouts 227 and the final height of the wedges 460 are a little more than that of the second cutouts 227. Thus, the two wedges 460 easily extend through the corresponding second cutout 227 and are prevented from sliding out of the housing

220. Each of side fins 460 includes a second rib 462, which faces the second surface 426 of the operating member 42. The second ribs 462 are used for contacting with the bottom 224 of the housing 220 and decreasing a contact area between the side fins 460 and the bottom 224 as a result, allowing the operating member 42 to smoothly slide with respect to the housing 220.

Figure 6:
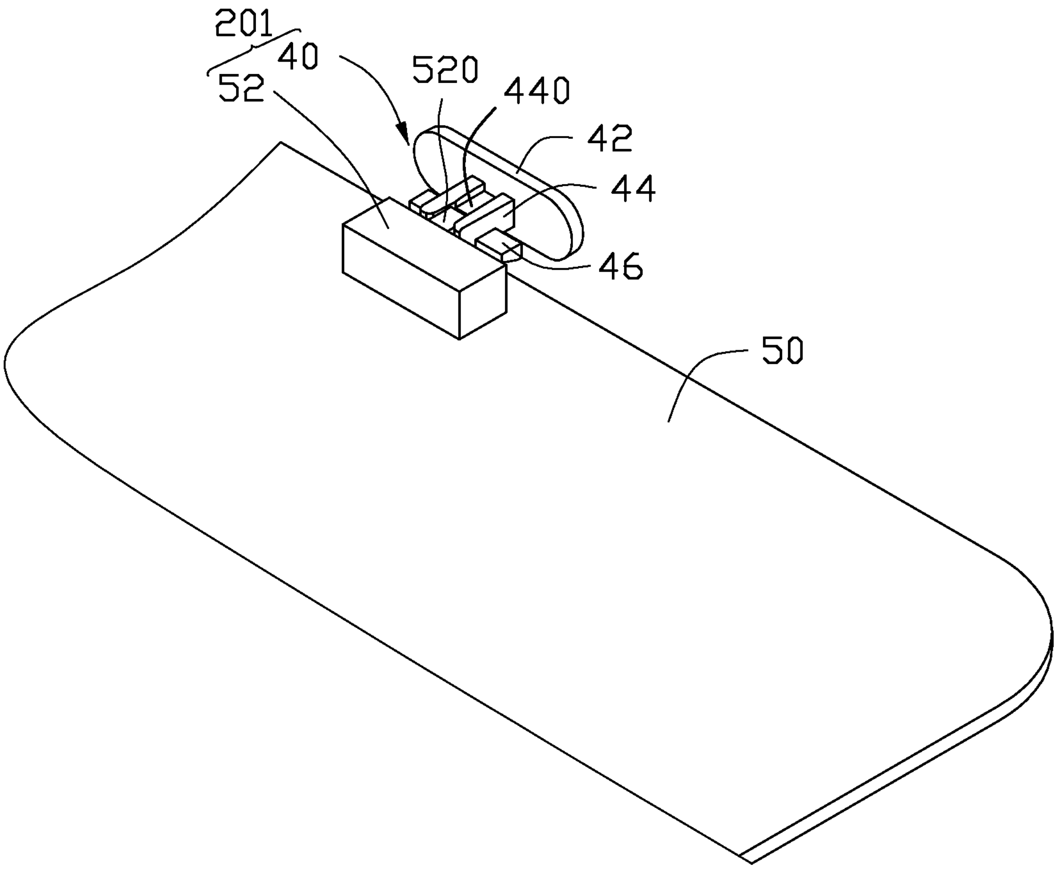
FIG. 6 is a partial view of the circuit board with the slide button mounted thereto.
Figure 7:
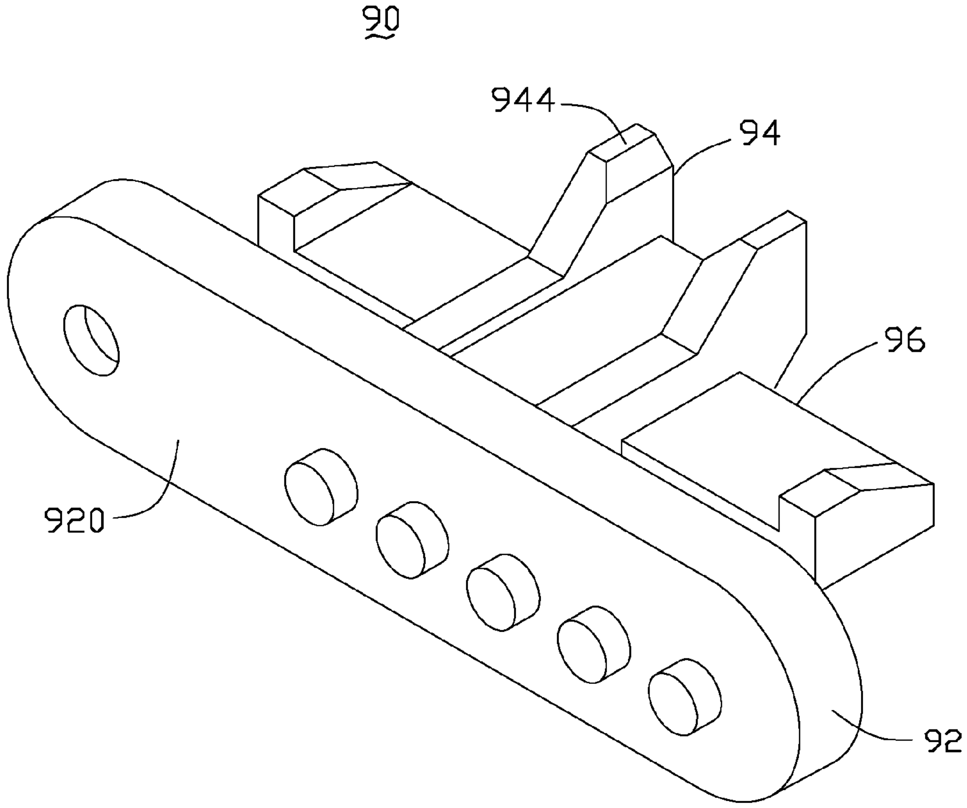
FIG. 7 (RELATED ART)
FIG. 7 is a schematic diagram showing a typical slide button.

Referring to FIG. 6, the toggle switch 52 is soldered on the circuit board 50 with a tip 520 thereof projecting from the circuit board 50. The toggle switch 52 may be a two-stage switch or a multi-stage switch, which can switch a current mode of the electronic device 100 between two or multiple modes by pushing or sliding the tip 520. The tip 520 of the toggle switch 52 is received in the opening 446 and is positioned between the two side fins 460. Thus, the tip 520 can be pushed or can slide with the activating member 44.

Referring to FIGS. 3, 4, and 6, an assembly procedure of slide button 40 and the base 20 will be described in detail.

The round corners 448 of the tail fin 442 flatly extend through the first cutout 226 in the sidewall 22. The side fins 460 respectively and flatly extend through the second cutouts 226 in the sidewall 22. After the above procedures, the rear portions of the two tail fins 442 are across the bottom 224 of the housing 220. The slide button 40 is horizontally positioned.

The combination of the slide button 40 and the sidewall 22 is assembled to the bottom casing 30 to form the base 20 with the circuit board 50 received therein. The slide button 40 on the sidewall 22 is aligned with the toggle switch 52 on the circuit board 50. The tip 520 is received in the opening 446 of the two tail fins 442. Thus, the two tail fins 442 sandwiches the tip 520 therebetween. The toggle switch 52 and the slide button 40 cooperate to form a switching assembly 201.

When changing a current mode of the electronic device 100, the slide button 40 is pushed to slide along the housing 220. The tip 520 of the toggle switch 52 is forced to slide along with the slide button 40. A mode of the toggle switch 52 is changed, and the current mode of the electronic device 100 is thus changed accordingly.

The positioning member 46 of the slide button 40 adopts a symmetrical structure to balance a weight thereof. As the two tail fins 442 of the activating member 46 are attended to force the tip 520, the torque on the two tail fins 442 is approaching zero. The two tail fins 442 are able to bear force and concentrated stress respectively from the operating member 42 and the toggle switch 52. Thus, the two tail fins 442 are hard to crack.

In other embodiment, the slide button 40 can be utilized by many electronic devices, such as a portable computer, a DVD player, and a game player.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation to encompass all such modifications and similar arrangements.

What is claimed is:

1. An electronic device, comprising:

a hollow base with a housing exposing outside of the base, the housing comprising a bottom defining a first cutout and a second cutout therein;

a circuit board received inside of the base, the circuit board comprising a toggle switch mounted thereon; and a slide button mounted to the base, the slide button comprising:

an operating member slideably received in the housing for being operated to slide the operating portion in the housing, the operating member defining a first surface used for being applied a force therein and a second surface opposite to the first surface;

an activating member extending from the operating member through the first cutout and reaching the toggle switch, the activating member comprising:

two tail fins extending from the second surface, the two tail fins defining an opening, the toggle switch being received in the opening; and a connecting board extending from the second surface and into the opening for enhancing strength of the tail fin; and a positioning member connected to the two tail fins and spaced apart from the operating member, the positioning portion inserted through the second cutout and blocked by the bottom from disengaging from the second cutout;

wherein the bottom comprises two ribs used for contacting with the operating member and decreasing a contacting area between the bottom and the operating member.

2. The electronic device of claim 1, wherein the two tail fins sandwich the toggle switch, where respectively comprise a round corner at a distal end thereof for easily receiving the toggle switch.

3. The electronic device of claim 1, wherein the positioning member extends out from sides of the two tail fins to form two side fins, the two side fins are used for sandwiching the bottom of the housing together with the operating member.

4. The electronic device of claim 3, wherein each side fins comprises a wedge used for easily extending through the second cutout and preventing from being reset.

5. The electronic device of claim 3, wherein each of side fins comprises a rib, which faces the operating member, used for contacting with the bottom of the housing and decreasing a contacting area between the side fins and the bottom.

6. The electronic device of claim 1, wherein the first cutout and the second cutout are successively defined in the bottom of the housing, the first cutout has a large width than that of the second cutout, communicates with the second cutout, and interacts with the second cutout.

7. The electronic device of claim 6, wherein the first cutout and the second cutout cooperate to form being an invert T-shape.

8. The electronic device of claim 1, wherein the two ribs are positioned besides of the first cutout and are passed through the second cutout.

* * * * *